United States Patent
Ranjan et al.

(10) Patent No.: US 6,208,167 B1
(45) Date of Patent: Mar. 27, 2001

(54) VOLTAGE TOLERANT BUFFER

(75) Inventors: Nalini Ranjan; Sarathy Sribhashyam, both of Sunnyvale, CA (US)

(73) Assignee: S3 Incorporated, Santa Clara, CA (US)

( * ) Notice: Subject to any disclaimer, the term of this patent is extended or adjusted under 35 U.S.C. 154(b) by 0 days.

(21) Appl. No.: 08/974,073

(22) Filed: Nov. 19, 1997

(51) Int. Cl.[7] .............................................. H03K 19/0175

(52) U.S. Cl. .................................. 326/81; 326/68; 326/80

(58) Field of Search ................................. 326/68, 80–81, 326/83, 86, 121, 57–58

(56) References Cited

U.S. PATENT DOCUMENTS

| | | | |
|---|---|---|---|
| 5,144,165 | * 9/1992 | Dhong et al. | 326/80 |
| 5,151,621 | * 9/1992 | Goto | 326/58 |
| 5,300,835 | * 4/1994 | Assar et al. | 326/81 |
| 5,450,025 | * 9/1995 | Shay | 326/81 |
| 5,543,733 | * 8/1996 | Mattos et al. | 326/81 |
| 5,627,487 | * 5/1997 | Keeth | 326/87 |
| 5,834,948 | * 11/1998 | Yoshizaki et al. | 326/81 |
| 5,952,847 | * 9/1999 | Plants et al. | 326/81 |

OTHER PUBLICATIONS

Sedra et al. Microelectronic Circuits. Holt, Rinehart, and Winston. p. 343. 1987.*

* cited by examiner

Primary Examiner—Michael Tokar
Assistant Examiner—Steven S. Paik
(74) Attorney, Agent, or Firm—Fenwick & West LLP (57) ABSTRACT

The present invention provides a buffer for coupling circuitry operating at a low voltage to circuitry operating a high voltage, and vice versa. The buffer outputs signals in a range between the low voltage and a ground voltage lower than the low voltage, and maintains appropriate bias of a semiconductor junction in the buffer using the high voltage. For example, the high voltage can be applied to the body of an output stage pull-up PFET of the buffer to maintain reverse bias between the body and drain of the PFET even when signals at the high voltage are placed on the drain of the PFET by other circuitry. Some embodiments of the present invention include a voltage translator to translate signals output from circuitry operating at the low voltage into a control signal at either the ground voltage or the high voltage. The high voltage of the control signal is beneficial for turning OFF an output stage transistor of the buffer even in the presence of signals at the high voltage on an output of the buffer. The roles of the low and high voltage can also be reversed, for example, by using a ground voltage higher than the high voltage.

12 Claims, 6 Drawing Sheets

VOLTAGE TOLERANT BUFFER

BACKGROUND OF THE INVENTION

1. Field of the Invention

The present invention relates generally to circuits made using transistors, and particularly to buffers made using transistors for coupling a circuit operating at a low voltage to a circuit operating at a high voltage, or vice versa.

2. Description of the Related Art

There is a continuing need in the art of electronics to increase the number and decrease the size of transistors in integrated circuit (IC) chips to obtain greater complexity, functionality, computational power, and performance speed. There is also a continuing need to reduce the power consumed by IC chips due to increases in the number of transistors fabricated on such IC chips, and due to market demands for highly reliable and battery operated integrated circuitry. These various needs have prompted the development of mixed voltage integrated circuitry, wherein a circuit operating at a low voltage ($LV_{DD}$) is coupled to a circuit operating at a high voltage ($HV_{DD}$).

Such mixed voltage integrated circuitry typically includes an output buffer having an input coupled to an output of the circuit operating at $LV_{DD}$, and having an output coupled via a bus to an input or output of the circuit operating at $HV_{DD}$. An input buffer for the circuit operating at $LV_{DD}$ is also coupled to the bus in some instances.

Many conventional output buffers operate improperly or fail structurally when used in mixed voltage integrated circuitry. Signals at $HV_{DD}$ received at the output of a conventional output buffer can forward bias a drain/body semiconductor junction of a transistor or transistors in the output buffer. Further, a signal at $HV_{DD}$ on the bus can trigger a latch-up of these transistors. Such latch-up typically results in erroneously asserted signals at output and high leakage currents, and sometimes causes structural failure of the output buffer. Further, such latch-up can burn an IC Chip on which the output buffer is fabricated.

One type of conventional output buffer used in mixed voltage integrated circuitry includes a field effect transistor (FET) fabricated within a well that switches from receiving $LV_{DD}$ from an $LV_{DD}$ supply to receiving $HV_{DD}$ from a signal at $HV_{DD}$ on the bus. This type of well is commonly called a "floating well" because the voltage of the well can rise along with the voltage on the bus. A floating well typically is implemented in an output stage FET that drives the bus, as follows. The well and source of the output stage FET are coupled together using a first diode. The well and drain of the output stage FET are coupled together using a second diode. Finally, the well of the output stage FET is coupled to the source of a pre-output stage FET that drives the gate of the output stage FET.

A floating well is difficult to implement properly because the switching time for the floating well is highly dependent on layout pattern and operation of the diodes and transistors in the output and pre-output stages, and on the impedance of the bus and circuitry coupled to the bus. Further, the diodes used typically must have a low cut-in voltage for the floating well to operate properly. Fabrication of such diodes requires an expensive additional manufacturing procedure.

There is thus a continuing need for an improved output buffer for use in mixed voltage integrated circuitry. Such an output buffer should preferably be able to couple a circuit operating at $LV_{DD}$ to a circuit operating at $HV_{DD}$, and preferably should not suffer the device failure and improper operation encountered in conventional output buffers. Further, such an output buffer should preferably be easy to manufacture, operate quickly and reliably, and be highly tolerant to signals at $HV_{DD}$ received from the bus or other circuitry.

SUMMARY OF THE INVENTION

The present invention overcomes the device failure and improper operation encountered in conventional output buffers with a voltage tolerant output buffer for use in mixed voltage integrated circuitry. The voltage tolerant output buffer couples a circuit operating at $LV_{DD}$ ($LV_{DD}$ circuit) to a circuit operating alternatively at $HV_{DD}$ or $LV_{DD}$ ($HLV_{DD}$ circuit), where $LV_{DD}$ is lower than $HV_{DD}$. Unlike conventional output buffers, signals at $HV_{DD}$ from the $HLV_{DD}$ circuit will not induce latch-up or other improper operation of the voltage tolerant output buffer.

The voltage tolerant output buffer features a transistor having a body that is coupled to an $HV_{DD}$ supply. As used herein, the body of a transistor is defined to mean that region of semiconductor material which includes the conductive channel of the transistor when the transistor is turned ON. The $HV_{DD}$ supply maintains proper bias of a semiconductor junction defined between the body and an output of the transistor. The voltage tolerant output buffer also features asserting a high signal at $HV_{DD}$ to an input of this transistor to turn OFF the transistor fully, regardless of the voltage on the output.

One embodiment of the voltage tolerant output buffer comprises a driver and a voltage translator. The driver comprises a pull-up p-channel field effect transistor (PFET) and a pull-down n-channel field effect transistor (NFET). The source of the pull-up PFET is coupled to an $LV_{DD}$ supply. The source and body of the pull-down NFET are coupled to a ground voltage of $V_{SS}$ that is lower than $LV_{DD}$. The drains of the pull-up PFET and pull-down NFET are coupled together to form an output of the voltage tolerant output buffer. The output of the voltage tolerant output buffer is coupled via a bus to an input and/or output of the $HLV_{DD}$ circuit.

The body of the pull-up PFET is coupled to an $HV_{DD}$ supply. The $HV_{DD}$ supply maintains reverse bias of a drain/body semiconductor junction in the pull-up PFET even while signals at $HV_{DD}$ are on the drain of this PFET. The reverse bias of the drain/body semiconductor junction substantially reduces leakage currents and eliminates latch-up in the voltage tolerant output buffer. Both the $HV_{DD}$ supply and the $LV_{DD}$ supply are preferably incorporated in the $LV_{DD}$ circuit, but can be incorporated in other circuitry.

The $LV_{DD}$ circuit, voltage translator, and driver are coupled together as follows. The $LV_{DD}$ circuit has first and second outputs. The first output is coupled to an input of the voltage translator. The second output is coupled to the gate of the pull-down NFET of the driver. The voltage translator has an output responsive to signals received at the input thereof. The output of the voltage translator is coupled to the gate of the pull-up PFET of the driver.

Signals from the second output of the $LV_{DD}$ circuit control the gate of the pull-down NFET in a conventional manner. Signals from the first output of the $LV_{DD}$ circuit control the gate of the pull-up PFET of the driver as follows. In response to receiving a low signal at $V_{SS}$ from the $LV_{DD}$ circuit, the voltage translator asserts a low signal at $V_{SS}$ to the gate of the pull-up PFET of the driver. This low signal at $V_{SS}$ turns ON the pull-up PFET to assert a high signal at $LV_{DD}$ on the bus. However, in response to receiving a high signal at $LV_{DD}$ from the $LV_{DD}$ circuit, the voltage translator asserts a high signal at $HV_{DD}$ to the gate of the pull-up PFET of the driver. The high signal at $HV_{DD}$ asserted by the voltage translator is thus at a higher voltage level than the high signal at $LV_{DD}$ that was received by the voltage translator from the $LV_{DD}$ circuit. The high signal at $HV_{DD}$ beneficially turns OFF the pull-up PFET regardless of the voltage on the drain of the pull-up PFET.

More particularly, to ensure that a PFET is turned OFF, the gate of the PFET must be at a voltage at least as high as the higher of the voltage on the source and the voltage on the drain. In the driver, the voltage on the source of the pull-up PFET is at $LV_{DD}$. However, the drain of the pull-up PFET can be a voltage level above $LV_{DD}$. In particular, a high signal at $HV_{DD}$ on the bus typically raises the voltage on the drain of the pull-up PFET higher than the $LV_{DD}$ voltage on the source, especially if the pull-down NFET is turned OFF.

To prevent the pull-up PFET from turning "ON" in an abnormal manner that allows current to flow from the drain to the source, the voltage translator translates the high signal at $LV_{DD}$ received from the $LV_{DD}$ circuit into a high signal at $HV_{DD}$. The high signal at $HV_{DD}$ turns OFF the pull-up PFET regardless of the voltage on the drain of the pull-up PFET. This beneficially prevents current flow from the drain to the source in the pull-up PFET. Such current flow from the drain to the source would essentially short circuit the $HV_{DD}$ voltage on the drain through the "ON" PFET to the $LV_{DD}$ supply coupled to the source of the PFET. This short circuit would most likely damage the $LV_{DD}$ supply. The present invention thus beneficially eliminates such abnormally directed current and protects the $LV_{DD}$ supply from damage.

In operation, the signals output by the $LV_{DD}$ circuit place the driver into one of three states: 1) asserting a high signal at $LV_{DD}$ to the bus by turning ON the pull-up PFET and turning OFF the pull-down NFET OFF, 2) asserting a low output signal at $V_{SS}$ to the bus by turning OFF the pull-up PFET and turning ON the pull-down NFET, or 3) not asserting an output signal to the bus (tri-stated condition) by turning OFF both the pull-up PFET and the pull-down NFET. The driver operates properly even if tri-stated while a high signal at $HV_{DD}$ is on the bus. Such high signals can neither forward bias the drain/body semiconductor junction of the pull-up PFET, nor turn "ON" the pull-up PFET in the abnormal manner described above.

There are numerous alternative embodiments of the present invention. For example, an additional voltage translator can be coupled between the $LV_{DD}$ circuit and the pull-down NFET of the driver to improve delay symmetry. Alternatively, the voltage translator can be omitted and the $LV_{DD}$ circuit replaced with a circuit operating at $HV_{DD}$. Preferred embodiments of the present invention include a pre-driver that receives a data and control signal and asserts appropriate signals which in conjunction with one or more voltage translators places a driver into an appropriate one of the three states.

BRIEF DESCRIPTION OF THE DRAWINGS

FIG. 1A is a block diagram of a conventional field effect transistor having a gate, source, drain, and body, wherein the body comprises a well formed in the substrate of an integrated circuit chip, and wherein the body includes a conductive channel between the source and the drain when the transistor is turned ON.

FIG. 1B is a block diagram of a conventional field effect transistor having a gate, source, drain, and body, wherein the body comprises a portion of the substrate of an integrated circuit chip, and wherein the body includes a conductive channel between the source and the drain when the transistor is turned ON.

DETAILED DESCRIPTION OF THE INVENTION

For purposes of particularly describing the subject matter of the present invention, the component elements of transistors incorporated therein are first discussed. The body of a transistor is defined to mean that region of semiconductor material which includes the conductive channel of the transistor when the transistor is turned ON. For a transistor fabricated in a well formed in the substrate of an IC Chip, the body comprises this well. However, for a transistor fabricated in the substrate of an IC Chip without the use of a well, the body comprises a portion of the substrate.

Figure 1A:
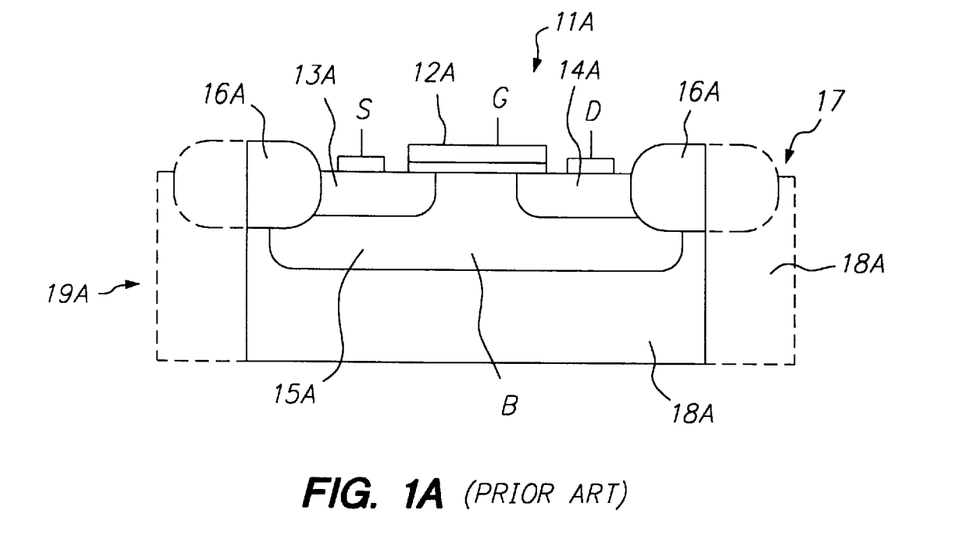

Referring now to FIG. 1A, there is shown a block diagram of a conventional field effect transistor 11A having a gate 12A, a source 13A, a drain 14A, and a body 15A, wherein the body 15A comprises a well formed in the substrate 18A of an IC Chip 19A. The body 15A of this transistor 11A includes a conductive channel between the source 13A and the drain 14A when the transistor 11A is turned ON. However, this conductive channel becomes substantially less conductive or non-conductive when the transistor 11A is turned OFF. The transistor 11A also includes insulators 16A which insulate the transistor 11A from other circuitry fabricated on the IC Chip 19A.

Figure 1B:
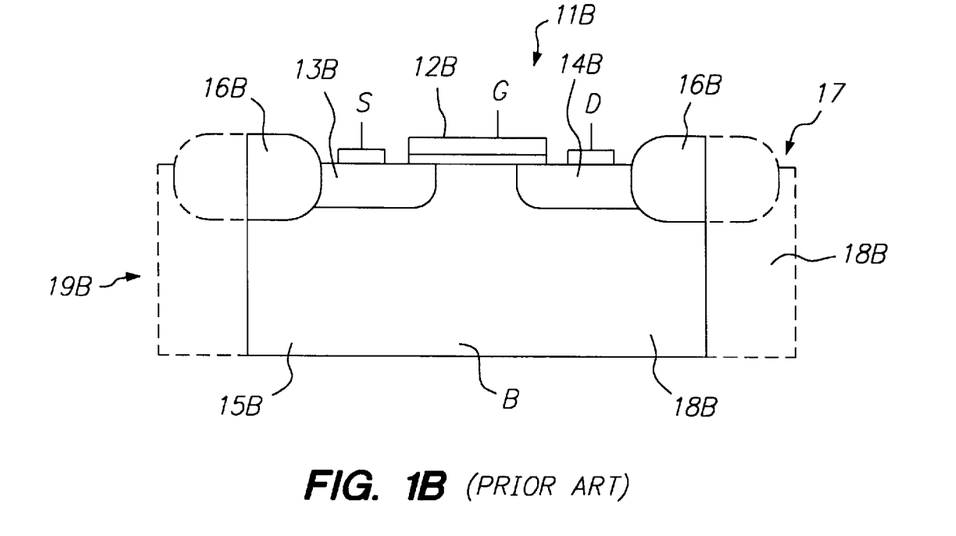

Referring now also to FIG. 1B there is shown a block diagram of a conventional field effect transistor 11B having a gate 12B, source 13B, drain 14B, and body 15B, wherein the body 15B comprises a portion of the substrate 18B of a second IC Chip 19B. The body 15B of this transistor 11B also includes a conductive channel between the source 13B and the drain 14B when the transistor 11B is turned ON. This conductive channel similarly becomes substantially less conductive or non-conductive when the transistor 11B is turned OFF. The transistor 11B also includes insulators 16B which insulate the transistor 11B from other circuitry fabricated on the IC Chip 19B.

The electrical connection ports G for the gate 12A, 12B, the electrical connection ports S for the source 13A, 13B, the electrical connection ports D for the drain 14A, 14B, and the electrical connection ports B for the body 15A, 15B of the se transistors 11A, 11B are also illustrated on FIGS. 1A, 1B respectively. These various ports allow electrical signals and biasing voltages to be applied to the transistors 11A, 11B. Typically, an electrical connection port B for the body of a transistor fabricated within a well is formed using a conductive path through the top 17 of an IC Chip into the well. This feature is well known in the art of electronics, and has not been illustrated in the FIG. 1A. Similarly, the substrate of an IC Chip can include an electrical connection port B fabricated through the top 17 of an IC Chip.

Field effect transistors 11A, 11B are illustrated on distinct IC Chips 19A, 19B respectively. However, it is common for both of these types of transistors to be fabricated on the same IC Chip. For example, a p-channel field effect transistor (PFET) can be fabricated in a well of positively doped semiconductor material disposed within an IC Chip having negatively doped substrate. The positively doped well forms the body of such a PFET. An n-channel field effect transistor can also be fabricated directly in this IC Chip. The body of this NFET comprises a portion of the substrate of the IC Chip.

Figure 2:
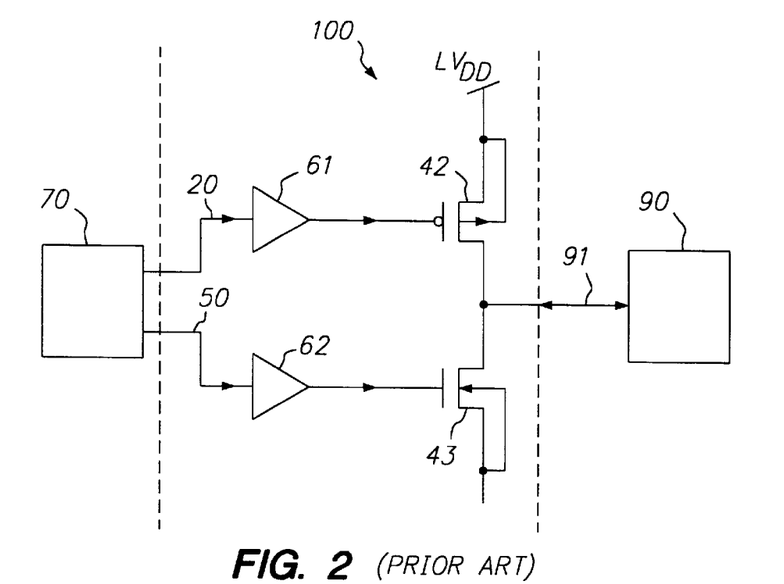
FIG. 2 is a block diagram of a conventional output buffer.

Referring now to FIG. 2, there is shown a block diagram of a conventional output buffer 100 used to couple a circuit 70 operating at the low voltage $LV_{DD}$ to a circuit 90 operating at the high voltage $HV_{DD}$, where $LV_{DD}$ is lower than $HV_{DD}$. Circuits 70, 90, 100 assert low signals at a ground voltage ($V_{SS}$) common to the circuits 70, 90, 100, where $V_{SS}$ is lower than $LV_{DD}$. Circuit 70 and the conventional output buffer 100 both assert high signals at $LV_{DD}$. However, circuit 90 asserts high signals at $HV_{DD}$. The bus 91 can carry signals in a voltage range from $V_{SS}$ to $HV_{DD}$.

The conventional output buffer 100 comprises: pre-drivers 61, 62, a pull-up PFET 42, and a pull-down NFET 43. The pre-driver 61 has an input coupled to a first output of circuit 70 by a line 20, and has an output coupled to the gate of the pull-up PFET 42. The pre-driver 62 has an input coupled to a second output of circuit 70 by a line 50, and has an output coupled to the gate of pull-down NFET 43. The source and body of the pull-up PFET 42 are coupled to an $LV_{DD}$ supply. The source and body of the pull-down NFET 43 are coupled to ground at $V_{SS}$. The drains of the pull-up PFET 42 and pull-down NFET 43 are coupled together to form the output of the conventional output buffer 100. This output is coupled to the bus 91, and asserts signals for output thereon.

The conventional output buffer 100 typically is used for non-mixed voltage integrated circuitry. For example, if all circuitry coupled to the bus 91 were operated at $LV_{DD}$, and all signals were asserted in a voltage range from $V_{SS}$ to $LV_{DD}$, then the conventional output buffer 100 could be operated as follows. The pre-driver 61 would turn ON the pull-up PFET 42 in response to a low signal at $V_{SS}$ on line 20 to assert a high signal at $LV_{DD}$ to the bus 91, and would turn OFF the pull-up PFET 42 in response to a high signal at $LV_{DD}$ on line 20. Similarly, the pre-driver 62 would turn ON the pull-down NFET 43 in response to a high signal at $LV_{DD}$ on line 50 to assert a low signal at $V_{SS}$ to the bus 91, and would turn OFF the pull-down NFET 43 in response to a low signal at $V_{SS}$ on line 50. Thus, signals typically would be selectively placed on lines 20 and 50 for: 1) asserting a high signal at $LV_{DD}$ to the bus 91 by turning ON the pull-up PFET 42 and turning OFF the pull-down NFET 43; 2) asserting a low signal at $V_{SS}$ to the bus 91 by turning OFF the pull-up PFET 42 and turning ON the pull-down NFET 43; and 3) not asserting a signal to the bus 91 by turning OFF both the pull-up PFET 42 and the pull-down NFET 43.

Unfortunately, the conventional output buffer 100 typically fails to operate properly when used in mixed voltage integrated circuitry as illustrated in FIG. 2. A high signal at $HV_{DD}$ on the bus 91 from the circuit 90 can forward bias the drain/body semiconductor junction in the pull-up PFET 42. This is an improper biasing of the drain/body semiconductor junction. Such improper biasing typically causes the conventional output buffer 100 to assert erroneous signal values to the bus 91. High leakage currents and subsequent damage to circuit 70 and the conventional output buffer 100 are common results of such improper biasing. Further, such improper biasing can trigger latch-up of the pull-up PFET 42 with the pull-down NFET 43. Such latch-up can result in very high current flow from the $LV_{DD}$ supply coupled to the source of pull-up PFET 42, through an abnormal conduction path in the pull-up PFET 42 and the pull-down NFET 43 induced by the latch-up, and into ground at $V_{SS}$. The very high current flow can induce heat failure in the pull-up PFET 42 and pull-down NFET 43, and burn an IC chip on which these transistors 42, 43 are fabricated.

Additional deficiencies are encountered if the conventional output buffer 100 is fabricated using a lower voltage manufacturing process than used is for fabricating circuit 90. The lower voltage manufacturing process produces transistors having thinner gate oxide and shallower wells than transistors fabricated with the higher voltage manufacturing process. If exposed to high signals at $HV_{DD}$ from the bus 91, the thinner gate oxide is likely to crack and the shallower wells are likely to overheat and structurally fail.

Figure 3:
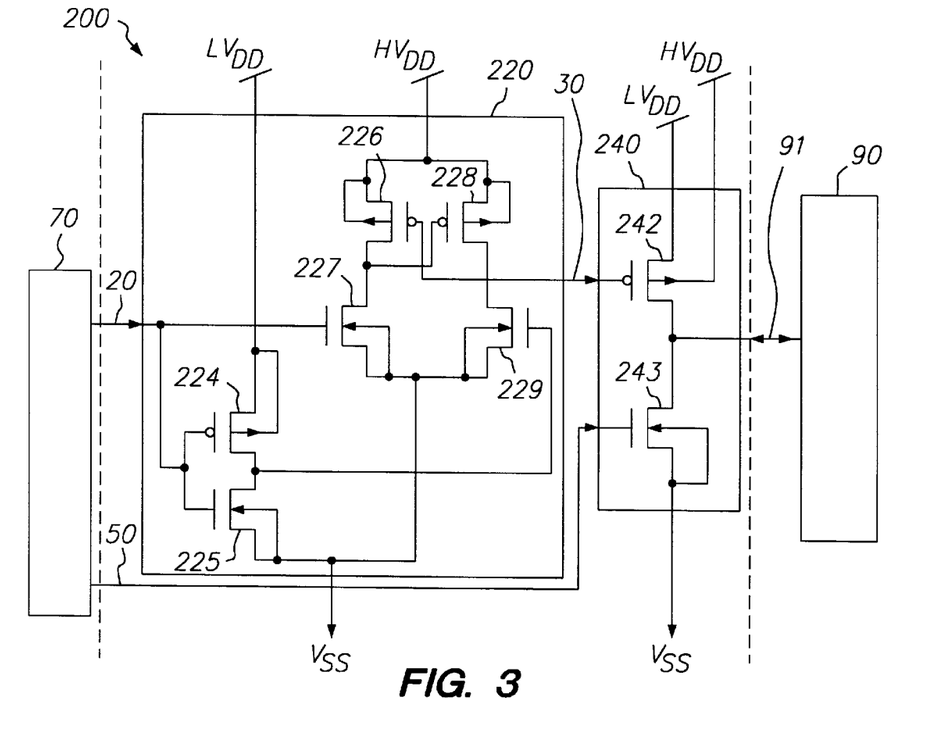
FIG. 3 is a block diagram of a first and preferred embodiment of a voltage tolerant input/output buffer of the present invention.

Referring now to FIG. 3, there is shown a block diagram of a first and preferred embodiment of a voltage tolerant output buffer 200 of the present invention for use in mixed voltage integrated circuitry. The voltage tolerant output buffer 200 is particularly beneficial for outputting signals from an $LV_{DD}$ circuit to an $HV_{DD}$ circuit, and does not encounter the improper operation and device failure of conventional output buffers. The voltage tolerant output buffer 200 can also be used to output signals from an $LV_{DD}$ to an $LV_{DD}$. For purposes of particularly disclosing the embodiments of the present invention, all circuitry illustrated uses a ground voltage specified as $V_{SS}$, where $V_{SS}$ is less than $LV_{DD}$.

The voltage tolerant output buffer 200 comprises a voltage translator 220 and a driver 240. The voltage translator 220 has an input coupled via line 20 to a first output of circuit 70, and has an output coupled via a line 30 to a first input of the driver 240. The driver 240 has a first input coupled via line 30 to the output of the voltage translator 220, a second input coupled via line 50 to a second output of circuit 70, and an output that serves as the output of the voltage tolerant output buffer 200. This output is coupled to the bus 91, and asserts signals for output thereon.

The voltage tolerant output buffer 200 operates in response to signals from the circuit 70. In particular, the voltage translator 220 asserts a low signal at $V_{SS}$ on line 30 in response to a low signal at $V_{SS}$ on line 20, and asserts a high signal at $HV_{DD}$ on line 30 in response to a high signal at $LV_{DD}$ on line 20. The driver 240 receives the signal on line 50 from circuit 70, and receives the signal on line 30 from the voltage translator 220. These two signals together place the output of the driver 240 into one of three states: 1) asserting a high signal at $LV_{DD}$ to the bus 91; 2) asserting a low signal at $V_{SS}$ to the bus 91; or 3) not asserting an output signal to the bus 91, the tri-stated condition. The structure and operation of the driver 240 and the voltage translator 220 are discussed next in greater detail.

The driver 240 comprises a pull-up PFET 242 and a pull-down NFET 243. The gate of the pull-up PFET 242 is coupled via line 30 to the output of the voltage translator 220, and the gate of pull-down NFET 243 is coupled via line 50 to the circuit 70. The source of the pull-up PFET 242 is coupled to an $LV_{DD}$ supply. The source of the pull-down NFET 243 is coupled to ground at $V_{SS}$. The drains of the pull-up PFET 242 and pull-down NFET 243 are coupled together to form the output of voltage tolerant output buffer 200.

The body of the pull-down NFET 243 is coupled to the ground at $V_{SS}$. The body of pull-up PFET 242 is coupled to an $HV_{DD}$ supply. The $HV_{DD}$ supply maintains reverse bias of the drain/body semiconductor junction of the pull-up PFET 242 even while high signals at $HV_{DD}$ are on the bus 91. The reverse bias of this drain/body semiconductor junction substantially reduces leakage currents and eliminates latch-up in the voltage tolerant output buffer 200.

The $LV_{DD}$ and $HV_{DD}$ supplies are preferably incorporated in circuit 70, but can be incorporated in other circuitry. The bus 91 carries signals from the output of the voltage tolerant output buffer 200 to the circuit 90. However, the bus 91 can also be used for carrying input signals and output signals without adversely impacting operation of the voltage tolerant output buffer 200.

The voltage translator 220 comprises a plurality of pull-up PFETs 224, 226, 228, and a plurality of pull-down NFETs 225, 227, 229. The gates of the pull-up PFET 224 and pull-down NFETs 225, 227 are coupled to line 20. These gates thus receive signals from the first output of circuit 70.

The source and body of the pull-up PFET 224 are coupled to the $LV_{DD}$ supply. The source and body of the pull-down NFET 225 are coupled to ground at $V_{SS}$. The drains of the pull-up PFET 224 and pull-down NFET 225 are coupled together to form the output of a conventional complementary metal oxide semiconductor (CMOS) inverter operating at $LV_{DD}$. This inverter thus outputs a signal at $V_{SS}$ in response to receiving a signal at $LV_{DD}$, and outputs a signal at $LV_{DD}$ in response to a signal at $V_{SS}$.

The output of the inverter is coupled to the gate of the pull-down NFET 229. The source and body of each of pull-up PFETs 226, 228 are coupled to the $HV_{DD}$ supply, and the source and body of each of pull-down NFETs 227, 229 are coupled to ground at $V_{SS}$. The drains of pull-up PFET 226 and pull-down NFET 227 are coupled together to the gate of pull-up PFET 228. The drains of pull-up PFET 228 and pull-down NFET 229 are coupled together to form the output of the voltage translator 220. This output is coupled to the driver 240 by line 30. This output is also coupled to the gate of pull-up PFET 226.

The voltage tolerant output buffer 200 operates as follows. A signal on line 20 is received by the voltage translator 220 at the gates of the pull-up PFET 224 and pull-down NFET 225. The inverter formed by these transistors 224, 225 asserts an inverted signal to the gate of pull-down NFET 229. This inverted signal is at $LV_{DD}$ if the signal on line 20 is at $V_{SS}$, and vice versa. The signal on line 20 is also received at the gate of the pull-down NFET 227.

A high signal at $LV_{DD}$ on line 20 turns OFF the pull-down NFET 229 and turns ON the pull-down NFET 227, which asserts a low signal at $V_{SS}$ at the drain of pull-down NFET 227. This low signal at $V_{SS}$ turns ON the pull-up PFET 228, which asserts a high signal at $HV_{DD}$ via line 30 to the gate of the pull-up PFET 242 of the driver 240. This high signal also turns the pull-up PFET 226 OFF while the pull-down NFET 227 is ON.

A low signal at $V_{SS}$ on line 20 turns OFF the pull-down NFET 227 and turns ON the pull-down NFET 229, which asserts a low signal at $V_{SS}$ on the drain of the pull-down NFET 229. This low signal at $V_{SS}$ is asserted via line 30 to the gate of the pull-up PFET 242 of driver 240. This low signal also turns ON the pull-up PFET 226, and thus asserts a high signal at $HV_{DD}$ at the drain of pull-up PFET 226. This high signal at $HV_{DD}$ turns OFF the pull-up PFET 228 while the pull-down NFET 229 is turned ON. The voltage translator 220 thus asserts a low signal at $V_{SS}$ via line 30 to driver 240 in response to receiving a low signal at $V_{SS}$ on line 20. Further, this voltage translator 220 asserts a high signal at $HV_{DD}$ to driver 240 in response to receiving a high signal at $LV_{DD}$ on line 20, as desired. Therefore, when the circuit 70 signals to turn OFF the pull-up PFET 242, the voltage translator 220 asserts a high signal at $HV_{DD}$ to the gate of this PFET 242 to ensure that this will be the case.

The gate of the pull-up PFET 242 of the driver 240 receives the signal asserted on line 30 by the voltage translator 220. The high signal at $HV_{DD}$ asserted by the voltage translator 220 on the gate of the pull-up PFET 242 of the driver 240 is beneficial for turning OFF the pull-up PFET 242 regardless of the voltage on the bus 91.

More particularly, a high signal at $LV_{DD}$ asserted on the gate of the pull-up PFET 242 would typically turn OFF the pull-up PFET 242 provided that the voltage level of the drain of pull-up PFET 242 never exceeds $LV_{DD}$. However, the high signal at $LV_{DD}$ could turn "ON" the pull-up PFET 242 in an abnormal manner while the voltage level of the drain is at $HV_{DD}$. This would occur because the voltage on the gate would be less than the voltage on the drain. This "ON" state is abnormal because the roles of the drain and source essentially would be reversed in the pull-up PFET 242, and current would flow from the drain at a voltage level of $HV_{DD}$ to the source at a voltage level of $LV_{DD}$. The voltage level of the drain of the pull-up PFET 242 could rise sufficiently above $LV_{DD}$ to allow such an abnormal "ON" state in the pull-up PFET 242 if high signals were asserted at the $LV_{DD}$ voltage level to the gate of the pull-up PFET 242. Such an abnormal "ON" state in the pull-up PFET 242 would essentially short circuit an $HV_{DD}$ supply for circuit 90 through the ON pull-tip PFET 242 to the $LV_{DD}$ supply used by voltage tolerant output buffer 200. Such a short circuit would most likely damage the $LV_{DD}$ supply.

To prevent the pull-up PFET 242 from turning "ON" in this abnormal manner, the voltage translator 220 asserts a high signal at $HV_{DD}$ via line 30 to the gate of the pull-up PFET 242 in response to receiving a high signal at $LV_{DD}$ via line 20 from circuit 70. The high signal at $HV_{DD}$ from the voltage translator 220 turns OFF the pull-up PFET 242 of the driver 240 even while a signal at $HV_{DD}$ is on the bus 91.

The signals output by circuit 70 place the driver 240 into one of three states: 1) asserting a high output signal to the bus 91 by turning ON the pull-up PFET 242 and turning OFF the pull-down NFET 243, 2) asserting a low output signal to the bus 91 by turning OFF the pull-up PFET 242 and turning ON the pull-down NFET 243, or 3) not asserting an output signal to the bus 91 (the tri-stated condition) by turn OFF both the pull-up PFET 242 and the pull-down NFET 243, as illustrated in TRUTH TABLE 1 below.

TRUTH TABLE 1

| Line 20 | Line 30 | Line 50 | Output of Voltage Tolerant Output Buffer 200 |
|---------|---------|---------|----------------------------------------------|
| low signal ($V_{SS}$) | low signal ($V_{SS}$) | low signal ($V_{SS}$) | high signal ($LV_{DD}$) (PFET 242 ON & NFET 243 OFF) |
| low signal ($V_{SS}$) | low signal ($V_{SS}$) | high signal ($LV_{DD}$) | NOT VALID & NOT USED (PFET 242 ON & NFET 243 ON) |
| high signal ($LV_{DD}$) | high signal ($HV_{DD}$) | low signal ($V_{SS}$) | no signal output (tri-stated condition) (PFET 242 off & NFET 243 OFF) |
| high signal ($LV_{DD}$) | high signal ($HV_{DD}$) | high signal ($LV_{DD}$) | low signal ($V_{SS}$) (PFET 242 ON & NFET 243 ON) |

The driver 240 operates properly even if tri-stated while a signal at $HV_{DD}$ is on the bus 91. The drain/body semiconductor junction of the pull-up PFET 242 remains properly reverse biased because the body of the pull-up PFET 242 is coupled to the $HV_{DD}$ supply. Hence, the body of this PFET 242 is maintained at a voltage at least as high as voltage on the drain of the PFET 242 even while a high signal at $HV_{DD}$ is Oil the bus 91. Further, the gate of the pull-up PFET 242 of the driver 240 receives a high signal at $HV_{DD}$ when the pull-up PFET 242 should be turned OFF to ensure that the pull-up PFET 242 remains turned OFF when it should be turned OFF, even while a high signal at $HV_{DD}$ is on the bus 91.

The voltage tolerant output buffer 200 is preferably implemented on a single IC chip using a process suitable for manufacturing transistors that operate at $HV_{DD}$. Such processes are beneficial because the voltage translator 220 asserts high signals at $HV_{DD}$ and the driver 240 receives signals both from the voltage translator 220 and potentially via the bus 91 at or substantially at $HV_{DD}$. Further, such manufacturing processes are easily adapted for implementing both $LV_{DD}$ and $HV_{DD}$ supplies. The IC chip can use negatively doped semiconductor material as substrate with PFETs such as the PFET 242 being formed in the substrate without a well. Alternatively the IC chip can use positively doped semiconductor material as substrate and implement PFETs such as the PFET 242 in a well comprising negatively doped semiconductor material.

Figure 4A:
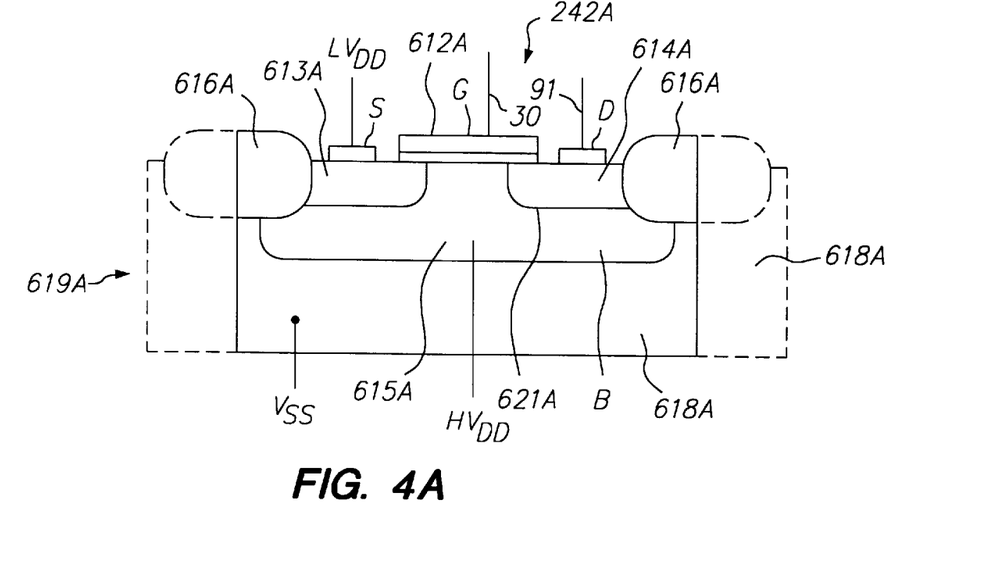
FIG. 4A is a block diagram illustrating a first embodiment a p-channel field. effect transistor of a driver of the present invention, wherein the body of the transistor comprises a well formed in the substrate of an integrated circuit chip.

Referring now to FIG. 4A there is shown a block diagram of a first embodiment 242A of the pull-up PFET 242 used in the driver 240 illustrated in FIG. 3. The pull-up PFET 242A comprises a body 615A, a source 613A, and a drain 614A, and a gate 612A. The body 615A comprises a well of negatively doped semiconductor material formed in a positively doped substrate 618A of an IC Chip 619A. The source 613A comprises a positively doped semiconductor material formed in one end of the well. The source 613A is coupled to the $LV_{DD}$ supply. The drain 614A comprises a positively doped semiconductor material formed at another end of the well. The drain 614A is coupled to the bus 91 for asserting signals in thereon. The gate 612A comprises a conductive or semiconductive material disposed over the well in conventional manner. The gate 612A is coupled to line 30 for receiving the signal asserted by the voltage translator 220 (not shown). The pull-up PFET 242A also includes insulators 616A which insulate the PFET 242A from other circuitry fabricated on the IC Chip 619A.

The body 615A is coupled to the $HV_{DD}$ supply. This allows the body 615A to form a conductive channel between the source 613A and the drain 614A when the PFET 242A is turned ON. This also assures that the conductive channel becomes non-conductive when the transistor 242A is turned OFF. Coupling the $HV_{DD}$ supply to the body 615A also maintains reverse bias of the drain/body semiconductor junction 621A. This semiconductor junction 621A will not be forward biased by high signals at $HV_{DD}$ received at the drain 614A.

Coupling the body 615A of the pull-up PFET 242A to the $HV_{DD}$ supply is included in the present invention and is highly beneficial. This coupling eliminates latch-up within this PFET 242A and also between this PFET 242A and any other transistors on the IC Chip 619A. In particular, the drain 614A, body 615A, and substrate 618A essentially form a PNP bipolar transistor. The emitter, base, and collector of this PNP bipolar transistor are formed respectively by the drain 614A, the body 615A, and the substrate 618A. Such a PNP bipolar transistor is parasitic in PFETs formed in a well. Coupling the body 615A to the $HV_{DD}$ supply prevents this bipolar transistor from turning ON. This beneficially prevents leakage currents from flowing from the emitter to the collector; i.e., from the drain 614A to the substrate 618A. Eliminating the leakage currents both saves power and also prevents heat damage to the IC Chip 619A.

Figure 4B:
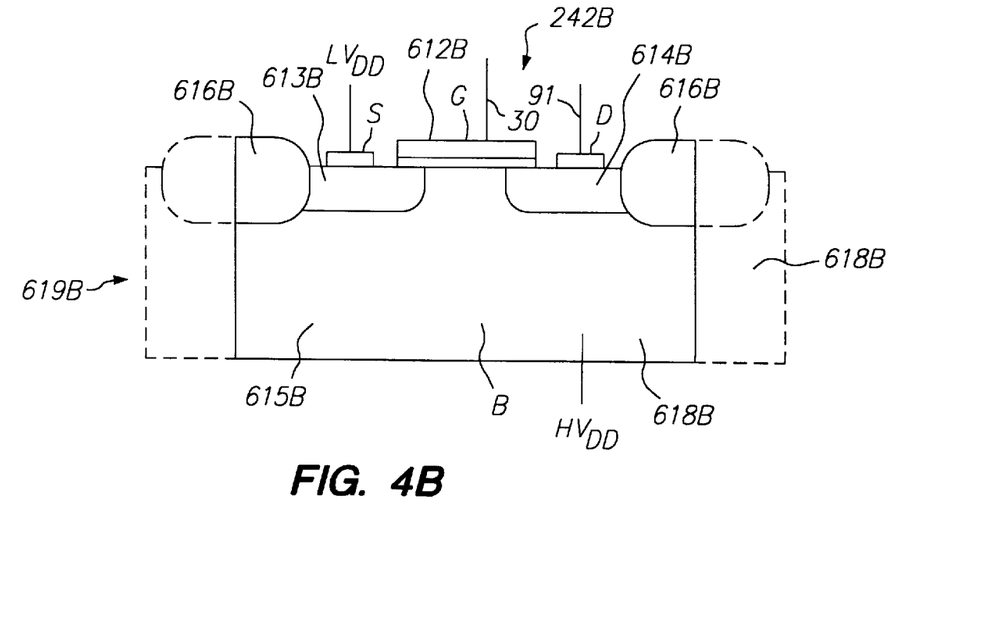
FIG. 4B is a block diagram illustrating a second embodiment of a p-channel field effect transistor of a driver of the present invention, wherein the body of the transistor comprises a portion of the substrate of an integrated circuit chip.

Referring now also to FIG. 4B there is shown a block diagram of a second embodiment 242B of the pull-up PFET 242 used in the driver 240 illustrated in FIG. 3. The pull-up PFET 242B comprises a body 615B, a source 613B, and a drain 614B, and a gate 612B. The body 615B comprises a portion of a positively doped substrate 618B of an IC Chip 619B. The body 615B is coupled to the $HV_{DD}$ supply both to allow formation of a conductive channel in the body 615B when the transistor 242B is turned ON, and also to prevent latch-up and other forms of leakage currents. The source 613B comprises a positively doped semiconductor material formed in this substrate 618B. The source 613B is coupled to the $LV_{DD}$ supply. The drain 614B also comprises a positively doped semiconductor material formed in this substrate 618B. The drain 614B is coupled to the bus 91 for asserting signals thereon. The gate 612B is disposed over the well in conventional manner. The gate 612B is coupled to line 30 for receiving the signal asserted by the voltage translator 220 (FIG. 3). The pull-up PFET 242B also includes insulators 616B which insulate the PFET 242B from other circuitry fabricated on the IC Chip 619B. The benefits provided by this embodiment of the present invention are similar to those discussed above with respect to FIG. 4A.

Figure 5:
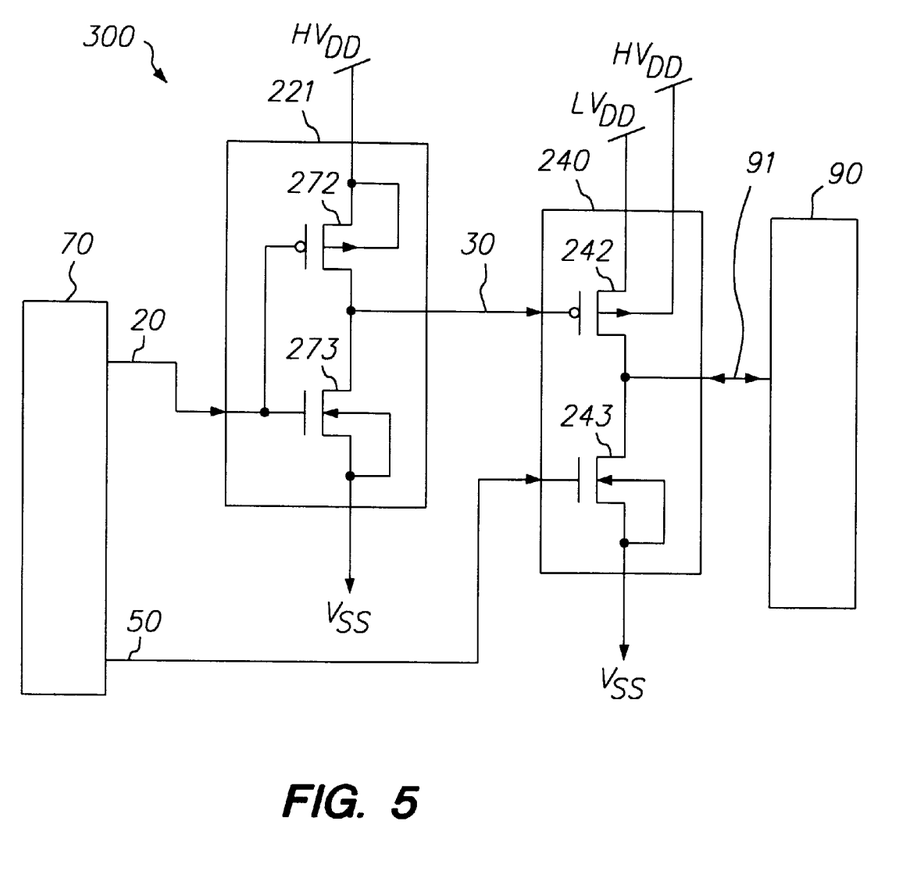
FIG. 5 is a block diagram of an alternative and second embodiment of a voltage tolerant input/output buffer of the present invention including a voltage translator that inverts an input signal.

Referring now to FIG. 5, there is shown an alternative and second embodiment of a voltage tolerant output buffer 300 of the present invention comprising the driver 240 and a voltage translator 221. The driver 240 has the same design as in voltage tolerant output buffer 200. The voltage translator 221 comprises a pull-up PFET 272 and a pull-down NFET 273 coupled as a complementary metal oxide semiconductor (CMOS) inverter operating at $HV_{DD}$. The voltage translator 221 both inverts and translates the voltage levels of received signals. In particular, the voltage translator 221 asserts a high signal at $HV_{DD}$ on line 30 in response to receiving a low signal at $V_{SS}$, and asserts a low signal at $V_{SS}$ on line 30 in response to receiving a high signal at $LV_{DD}$. Circuit 70 is modified to invert the signal on line 20 to account for the inversion of received high and low signals by the voltage translator 221. Those skilled in the art will understand that signal values applied on line 20 from the circuit 70 must be the inverse of those shown in Truth Table 1.

Another alternative embodiment of the present invention includes a modified circuit 70 that operates at $HV_{DD}$. The modified circuit 70 supplies signals directly to the driver 240 at the gates of the pull-up PFET 242 and pull-down NFET 243. The gate of the pull-up PFET 242 of the driver 240 thus receives a high signal at $HV_{DD}$ when the pull-up PFET 242 should be OFF. This high signal at $HV_{DD}$ ensures that the pull-up PFET 242 remains OFF when it should be OFF, even while a high signal at $HV_{DD}$ is on the bus 91. The voltage translator 200 is eliminated in this embodiment of the present invention.

Another alternative embodiment of the present invention asserts a high signal or a tri-stated condition to the bus 91 depending on the value of an input signal. For example, the pull-down NFET 243 can be omitted from voltage tolerant output buffer 200. The drain of the pull-up PFET 242 either asserts a high signal at $LV_{DD}$ to the bus 91, or does not assert a signal to the bus 91. The voltage translator 220, 221 can be omitted as well, if circuit 70 is modified to assert high signals at $HV_{DD}$ to the gate of pull-up PFET 242. Similarly, by omitting the pull-up PFET 242, an alternative embodiment of the present invention is formed that asserts a low signal or a tri-stated condition to the bus 91, depending on the value of an input signal.

As those skilled in the art will recognize, the present invention encompasses other voltages for $LV_{DD}$, $HV_{DD}$, and $V_{SS}$, as well as distinct ground voltage levels for distinct components of the present invention. For example, the present invention can be used where $V_{SS}$ equals 0 Volts in circuit 70 and 1 Volt in circuit 90, $LV_{DD}$ equals 3 Volts, and $HV_{DD}$ equals 5 Volts. Similarly the present invention can be used in mixed voltage circuitry where circuit 90 operates at a lower voltage than circuit 70 which in turn operates at a lower voltage than a ground for circuits 70 or 90.

Figure 6:
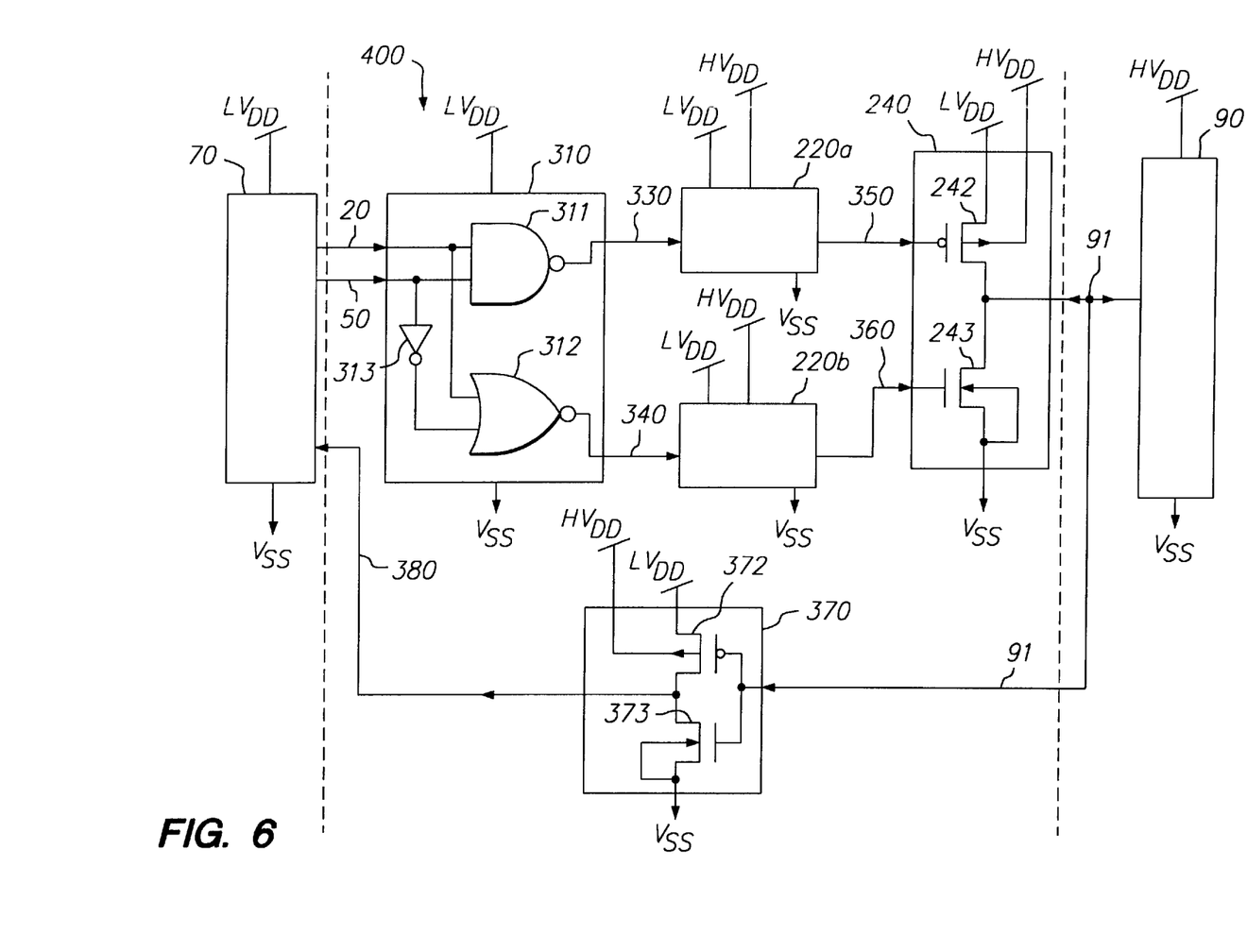
FIG. 6 is a block diagram of an alternative and third embodiment of a voltage tolerant output buffer of the present invention that includes a pre-driver that drives a pair of voltage translators which together drive a driver.

Referring now to FIG. 6, there is shown an alternative and third embodiment of a voltage tolerant input/output buffer 400 of the present invention. Voltage tolerant input/output buffer 400 is coupled to circuits 70 and 90, the bus 91, ground at $V_{SS}$, the $LV_{DD}$ supply, and the $HV_{DD}$ supply. Voltage tolerant input/output buffer 400 comprises first and second voltage translators 220a, 220b, a driver 240 having a pull-up PFET 242 and pull-down NFET 243, lines 330, 340, 350, 360, 380, a pre-driver 310, and an input buffer 370 for receiving signals via the bus 91.

The pre-driver 310 comprises a NAND gate 311, a NOR gate 312, and an inverter 313. The pre-driver 310 beneficially allows line 20 to hold a data signal for output and line 50 to hold a control signal. The control signal alternatively enables the driver 240 for outputting data, or places the driver 240 in a tri-stated condition that does not assert an output signal to the bus 91. The input buffer 370 comprises a pull-up PFET 372 and a pull-down NFET 373. The input buffer 370 beneficially allows circuit 70 to receive signals via the bus 91 from, for example, circuit 90.

Voltage tolerant input/output buffer 400 is configured as follows. Lines 20, 50 from circuit 70 are coupled to the pre-driver 310. In particular, line 20 is coupled both to an input of NAND gate 311, and to an input of NOR gate 312. Line 50 is coupled both to an additional input of NAND gate 311, and to an input of inverter 313. The inverter 313 has an output coupled to an additional input of the NOR gate 312. The pre-driver 310 is coupled both to the $LV_{DD}$ supply, and to ground at $V_{SS}$. The pre-driver 310 operates at the $LV_{DD}$ voltage level.

The output of the NAND gate 311 is coupled via line 330 to an input of the first voltage translator 220a. This voltage translator 220a has an output coupled vial line 350 to the gate of the pull-up PFET 242 of the driver 240. Similarly, the output of the NOR gate 312 is coupled via line 340 to an input of the second voltage translator 220b. This second voltage translator 220b has an output coupled via line 360 to the gate of the pull-down NFET 243.

The driver 240 is coupled via the bus 91 to circuit 90 as in voltage tolerant output buffer 200 of FIG. 3. However, the bus 91 is additionally coupled to an input of the input buffer 370 at the gates of the pull-up PFET 372 and pull-down NFET 373, with the source and body of pull-down NFET 373 coupled to ground at $V_{SS}$, the source of pull-up PFET 372 coupled to the $LV_{DD}$ supply, and the body of pull-up PFET 372 coupled alternatively to the $HV_{DD}$ supply as illustrated or to the $LV_{DD}$ supply.

The incorporation of two voltage translators 220a, 220b in voltage tolerant input/output buffer 400 substantially equalizes the delay of a top output path defined from the outputs of circuit 70 to the gate of the pull-up PFET 242 of the driver 240 with the delay of a bottom output path defined from the outputs of circuit 70 to the gate of the pull-down NFET 243 of the driver 240. Additionally, both the pull-up PFET 242 and pull-down NFET 243 receive signals alternatively at $V_{SS}$ or $HV_{DD}$. These properties help to equalize the delay on the top output path with the delay on bottom output path, which reduces glitches in signals asserted by driver 240 to the bus 91.

The pre-driver 310 beneficially allows line 20 from circuit 70 to hold a data signal for output and line 50 from circuit 70 to hold a control signal. The control signal alternatively enables the driver 240 for outputting data from voltage tolerant input/output driver 400, or places the driver 240 in a ti-stated condition that does not assert an output signal to the bus 91. The tri-stated condition is useful both for not asserting a signal to the bus 91 when no signal should be asserted, and additionally for allowing the input buffer 370 to receive signals on the bus 91 from other circuitry coupled to the bus 91, such as circuit 90.

The signals output by circuit 70 on lines 20, 50 place the driver 240 into one of three states: 1) asserting a high signal at $LV_{DD}$ to the bus 91 by turning ON the pull-up PFET 242 and turning OFF the pull-down NFET 243, 2) asserting a low signal at $V_{SS}$ to bus 91 by turning OFF the pull-up PFET 242 and turning ON the pull-down NFET 243, or 3) not asserting an output signal (tri-stated condition) by turning OFF both the pull-up PFET 242 and the pull-down NFET 243, as illustrated in TRUTH TABLE 2 below.

TRUTH TABLE 2

| Line 50 Control | Line 20 Data | Line 350 | Line 360 | Input & Output of Voltage Tolerant Input/Output Buffer 400 |
|---|---|---|---|---|
| low signal ($V_{SS}$) | low signal ($V_{SS}$) | high signal ($HV_{DD}$) | low signal ($V_{SS}$) | no output signal (tri-state condition) input allowed from other circuits (PFET 242 OFF & NFET 243 OFF) |
| low signal ($V_{SS}$) | high signal ($LV_{DD}$) | high signal ($HV_{DD}$) | low signal ($V_{SS}$) | no output signal (tri-state condition) input allowed from other circuits (PFET 242 OFF&NFET 243 OFF) |
| high signal ($LV_{DD}$) enable | low signal ($V_{SS}$) | high signal ($HV_{DD}$) | high signal ($HV_{DD}$) | low signal ($V_{SS}$) (PFET 242 OFF & NFET 243 ON) |
| high signal ($LV_{DD}$) enable | high signal ($LV_{DD}$) | low signal ($V_{SS}$) | low signal ($V_{SS}$) | high signal ($LV_{DD}$) PFET 242 ON & NFET 243 OFF |

The driver 240 operates properly even while a signal at $HV_{DD}$ is on the bus 91. The drain/body semiconductor junction of the pull-up PFET 242 remains properly reverse biased because the body of the pull-up PFET 242 is coupled to the $HV_{DD}$ supply. The $HV_{DD}$ supply maintains the body at a voltage level at least as high as the voltage level of the drain, even while a high signal at $HV_{DD}$ is on the bus 91. Further, the gate of the pull-up PFET 242 of the driver 240 receives a high signal at $HV_{DD}$ when the pull-up PFET 242 should be OFF. This high signal $HV_{DD}$ ensures that the pull-up PFET 242 remains OFF when it should be OFF, even while a high signal at $HV_{DD}$ is on the bus 91. The delay on the top output path is substantially equal to the delay on the bottom output path, which reduces glitches in signals asserted by the driver 240 to the bus 91. Further, the control signal on line 50 determines whether the voltage tolerant input/output buffer 400 will assert a signal to bus 91, and the data signal on line 20 determines the value of any signal asserted by the voltage tolerant output buffer 400. The voltage tolerant input/output buffer can also receive input signals from other circuits.

Figure 7:
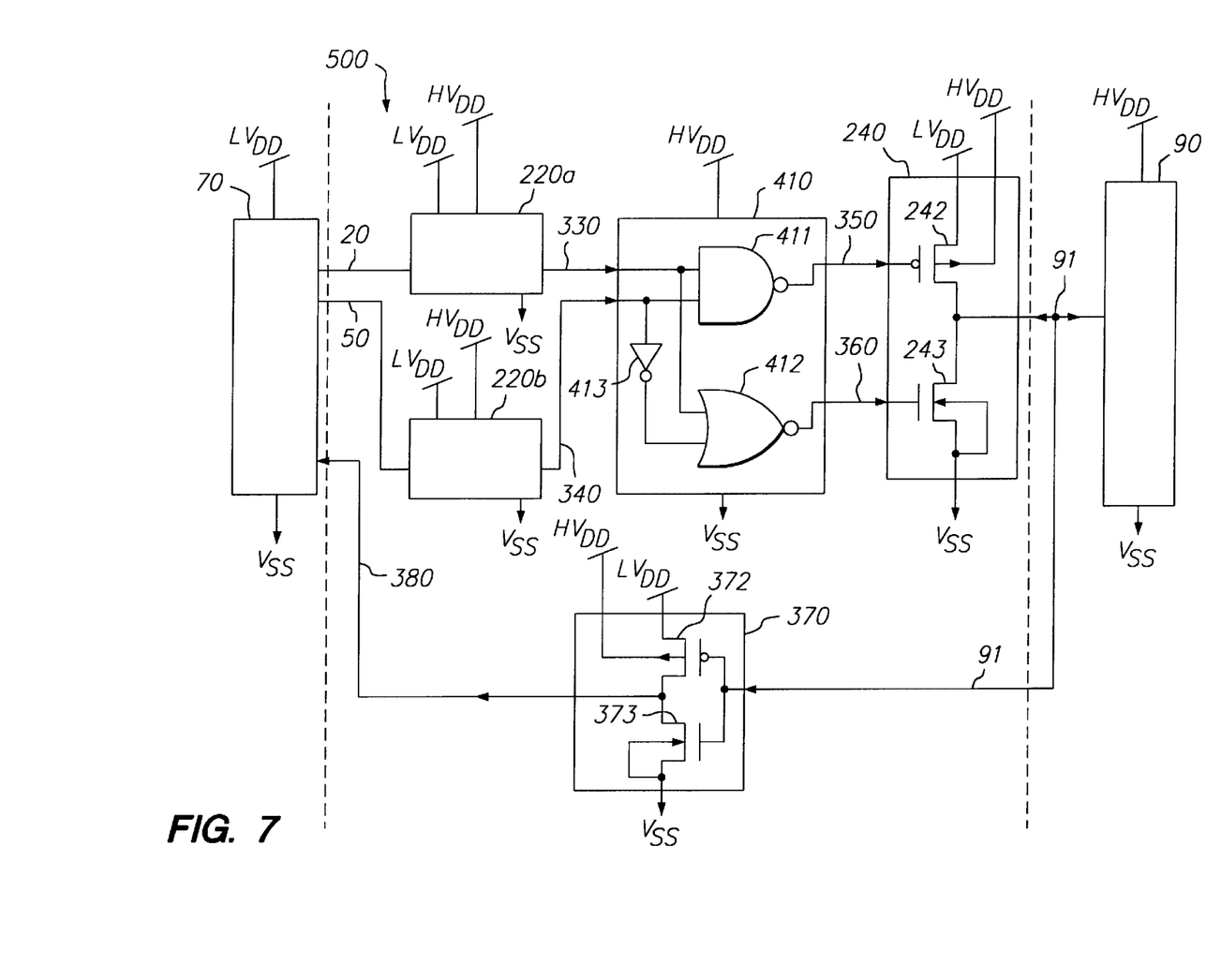
FIG. 7 is a block diagram of an alternative and fourth embodiment of a voltage tolerant output buffer of the present invention that includes a pre-driver that drives a pair of voltage translators which together drive a driver.

Referring now to FIG. 7, there is shown an alternative and fourth embodiment of a voltage tolerant input/output buffer 500 of the present invention. Voltage tolerant input/output buffer 400 is coupled to circuits 70 and 90, the bus 91, ground at $V_{SS}$, the $LV_{DD}$ supply, and the $HV_{DD}$ supply. Voltage tolerant input/output buffer 400 comprises the voltage translators 220a, 220b, the driver 240, the input buffer 370, and lines 20, 30, 330, 340, 350, 360, 380 of voltage tolerant output buffer 400. However, the pre-driver 310 is replaced by a pre-driver 410 that has the same logical structure as the pre-driver 310 but operates at the higher $HV_{DD}$ voltage level. The pre-driver 410 is disposed to receive signals output by the voltage translators 220a, 220b, unlike the pre-driver 310 of voltage tolerant output buffer 400.

Voltage tolerant input/output buffer 400 is configured as follows. Lines 20, 50 from circuit 70 are coupled to the input of voltage translator 220a, 220b, respectively. The output of voltage translator 220a is coupled via line 330 both to an input of NAND gate 411 and to an input of NOR gate 412. The output of voltage translator 220b is coupled both to an additional input of the NAND gate 411 and to an input of the inverter 413. The inverter 413 has an output coupled to an additional input of the NOR gate 412. The output of NAND gate 411 is coupled via line 350 to the gate of is the pull-up PFET 242, and the output of NOR gate 412 is coupled via line 360 to the gate of the pull-down NFET 243. The voltage translators 220a, 220b receive power and are grounded in the same manner as in voltage tolerant output buffer 400. The pre-driver 410 is grounded in the same manner as pre-driver 310, but receives power from the $HV_{DD}$ supply, as illustrated.

The voltage tolerant output buffers 400, 500 provide substantially equivalent benefits. Both buffers 400, 500 include two substantially equal delay paths from the circuit 70 to the gates of the pull-up PFET 242 and pull-down NFET 243 respectively, for minimizing glitches. Both buffers 400, 500 can be used to assert signals to the bus 91, and to assert a tri-stated condition to the bus 91 that allows the input buffer 370 to receive signals from the bus 91. The voltage tolerant output buffers 400, 500 both obey TRUTH TABLE 2 above. However, the voltages of signals on lines 330, 340 differs between these two buffers 400, 500.

While the present invention has been described with reference to certain preferred embodiments, those skilled in the art will recognize that various it modifications may be provided. Such modifications are provided for by the present invention which is limited only by the following claims.

What is claimed is:

1. A tri-state buffer having an output tolerant to a first, second and third voltage levels, the tri-state buffer comprising:

a NAND gate having a first input, a second input and an output, the first input of the NAND gate coupled to receive a first input signal, and the second input of the NAND gate coupled to receive a second input signal;

an inverter having an input and an output, the input of the inverter coupled to receive the second input signal;

a NOR gate having a first input, a second input and an output, the first input of the NOR gate coupled to receive the first input signal, and the second input of the NOR gate coupled to the output of the inverter;

a first transistor having a gate for receiving a first control signal, a body coupled to the second voltage level, a source coupled to the third voltage level, and a drain forming the output of the tri-state buffer, the first transistor supplying an output signal at the third voltage level or for supplying no signal in response to the first control signal, the gate of the first transistor coupled to the output of the NAND gate;

a second transistor having a gate for receiving a second control signal, a source coupled to the first voltage, and a drain coupled to the drain of the first transistor, the second transistor supplying an output signal at the first voltage level or for supplying no signal in response to the second control signal, the gate of the second transistor coupled to the output of the NOR gate; and a voltage translator having an input for receiving a third signal at one of the first voltage level and the third voltage level, the input of the voltage translator coupled to the output of the NAND gate, the voltage translator having an output coupled to the gate of the first transistor, the voltage translator supplying the first control signal at the first voltage level in response to receiving the third signal at the first voltage level, and the voltage translator supplying the first signal at the second voltage in response to receiving the third signal at the third voltage;

wherein the first and second control signals selectively place the output of the tri-state buffer in one state from the group of a state of outputting the first voltage level, a state of outputting the third voltage level, and a state of not outputting a signal.

2. The tri-state buffer of claim 1, wherein the second voltage on the body reverse biases a semiconductor junction between the body and the drain of the first transistor.

3. The tri-state buffer of claim 1, wherein the second voltage on the body reverse biases a semiconductor junction between the body and the source of the first transistor.

4. The tri-state buffer of claim 1, further comprising a voltage supply for supplying the second voltage to the body of the first transistor.

5. The tri-state buffer of claim 1, further comprising a voltage translator and inverter having an input for receiving a third signal at one of the first voltage level and the third voltage level, the voltage translator and inverter having an output coupled to the gate of the first transistor, the voltage translator and inverter supplying the first control signal at the first voltage level in response to receiving the third signal at the third voltage level, and the voltage translator supplying the first control signal at the second voltage in response to the input receiving the third signal at the first voltage level.

6. The tri-state buffer of claim 1, wherein the second transistor is field effect transistor.

7. The tri-state buffer of claim 1, wherein the second transistor is an n-channel field effect transistor and the first transistor is a p-channel field effect transistor.

8. The tri-state buffer of claim 1, wherein the first transistor is a field effect transistor.

9. The tri-state buffer of claim 1, wherein the second voltage level is higher than the first voltage level, and the third voltage level is between the first voltage level and the second voltage level.

10. The tri-state buffer of claim 1, wherein the body comprises a portion of a substrate of an integrated circuit chip.

11. The tri-state buffer of claim 1, wherein the body comprises a well formed in a substrate of an integrated circuit chip.

12. A tri-state buffer having an output tolerant to a first, second and third voltage levels, the tri-state buffer comprising:

a NAND gate having a first input, a second input and an output, the first input of the NAND gate coupled to receive a first input signal, and the second input of the NAND gate coupled to receive a second input signal;

an inverter having an input and an output, the input of the inverter coupled to receive the second input signal;

a NOR gate having a first input, a second input and an output, the first input of the NOR gate coupled to receive the first input signal, and the second input of the NOR gate coupled to the output of the inverter;

a first transistor having a gate for receiving a first control signal, a body coupled to the second voltage level, a source coupled to the third voltage level, and a drain forming the output of the tri-state buffer, the first transistor supplying an output signal at the third voltage level or for supplying no signal in response to the first control signal, the gate of the first transistor coupled to the output of the NAND gate;

a second transistor having a gate for receiving a second control signal, a source coupled to the first voltage, and a drain coupled to the drain of the first transistor, the second transistor supplying an output signal at the first voltage level or for supplying no signal in response to the second control signal, the gate of the second transistor coupled to the output of the NOR gate; and a voltage translator and inverter having an input for receiving a third signal at one of the first voltage level and the third voltage level, the voltage translator and inverter having an output coupled to the gate of the first transistor, the voltage translator and inverter supplying the first control signal at the first voltage level in response to receiving the third signal at the third voltage level, and the voltage translator supplying the first control signal at the second voltage in response to the input receiving the third signal at the first voltage level;

wherein the first and second control signals selectively place the output of the tri-state buffer in one state from the group of a state of outputting the first voltage level, a state of outputting the third voltage level, and a state of not outputting a signal.

* * * * *

UNITED STATES PATENT AND TRADEMARK OFFICE
CERTIFICATE OF CORRECTION

PATENT NO. : 6,208,167 B1
DATED : March 27, 2001
INVENTOR(S) : Nalini Ranjan et al.

It is certified that error appears in the above-identified patent and that said Letters Patent is hereby corrected as shown below:

<u>Column 15, claim 5,</u>
Line 43, after "is" add -- a --.

Signed and Sealed this

Sixteenth Day of October, 2001

Attest:

*Attesting Officer*

NICHOLAS P. GODICI
*Acting Director of the United States Patent and Trademark Office*